(12) United States Patent
Wang et al.

(10) Patent No.: US 12,489,401 B2
(45) Date of Patent: Dec. 2, 2025

(54) POWER AMPLIFYING CIRCUITS

(71) Applicant: Realtek Semiconductor Corp., HsinChu (TW)

(72) Inventors: Po-Chih Wang, HsinChu (TW); Hsiao-Tsung Yen, HsinChu (TW); Ka-Un Chan, HsinChu (TW)

(73) Assignee: Realtek Semiconductor Corp., HsinChu (TW)

( * ) Notice: Subject to any disclaimer, the term of this patent is extended or adjusted under 35 U.S.C. 154(b) by 594 days.

(21) Appl. No.: 17/873,176

(22) Filed: Jul. 26, 2022

(65) Prior Publication Data

US 2023/0047042 A1   Feb. 16, 2023

(30) Foreign Application Priority Data

Aug. 11, 2021   (TW) .................. 110129585

(51) Int. Cl.
*H03F 3/21*   (2006.01)
*H03F 1/02*   (2006.01)
*H03F 1/56*   (2006.01)

(52) U.S. Cl.
CPC .......... *H03F 1/0205* (2013.01); *H03F 1/565* (2013.01); *H03F 3/21* (2013.01); *H03F 2200/387* (2013.01)

(58) Field of Classification Search
CPC .......... H03F 1/0205; H03F 1/565; H03F 1/22; H03F 1/223; H03F 1/302; H03F 1/3217; H03F 1/50; H03F 3/21; H03F 3/193; H03F 3/265; H03F 3/195; H03F 3/245; H03F 3/45475; H03F 3/191; H03F 3/26; H03F 3/181; H03F 3/28; H03F 3/22; H03F 3/30; H03F 3/52; H03F 2200/387; H03F 2200/537; H03F 2200/541; H03F 2200/451; H03F 2200/72; H03F 2200/06; H03F 2200/09; H03F 2200/294; H03F 2200/372; H03F 2200/222; H03F 2200/318; H03H 7/42
USPC ......... 330/296, 55, 301, 311, 302, 275, 118, 330/119, 120
See application file for complete search history.

(56) References Cited

U.S. PATENT DOCUMENTS

| 6,496,069 B1 * | 12/2002 | Van De Westerlo ... H03F 3/265 330/276 |
| 7,728,662 B2 * | 6/2010 | Apel ..................... H03F 1/0244 330/296 |
| 9,438,180 B2 | 9/2016 | Wang |

(Continued)

*Primary Examiner* — Andrea Lindgren Baltzell
*Assistant Examiner* — Nareh Shamiryan
(74) *Attorney, Agent, or Firm* — Winston Hsu

(57) ABSTRACT

A power amplifying circuit includes a first input terminal applied with a first bias voltage, a first amplifying circuit generating a first output signal and a second output signal according to an input signal and a first matching circuit combining the first output signal and the second output signal to generate an output signal. The first amplifying circuit includes a first transistor having a first electrode coupled to the first input terminal and a second electrode applied with a second bias voltage and a second transistor having a first electrode s coupled to the first input terminal and a second electrode applied with a third bias voltage. The first transistor generates the first output signal according to the first bias voltage and the second bias voltage. The second transistor generates the second output signal according to the first bias voltage and the third bias voltage.

14 Claims, 5 Drawing Sheets

(56) References Cited

U.S. PATENT DOCUMENTS

2012/0064852 A1 3/2012 Lee
2017/0077877 A1* 3/2017 Anderson ............ H03F 1/0261

* cited by examiner

POWER AMPLIFYING CIRCUITS

BACKGROUND OF THE INVENTION

1. Field of the Invention

The invention relates to an amplifying circuit, more particularly to a push-pull common gate power amplifying circuit.

2. Description of the Prior Art

Amplifier circuits or amplifying circuits are the circuits frequently used in communication systems to increase the output power of signals. The amplifying circuit usually obtains the energy through the power supply, controls the waveform of the output signal to be consistent with the input signal, and increases its amplitude, thereby proportionally producing a larger signal at the output terminal.

Generally, the design of amplifying circuits needs to be traded off between power consumption and linearity. For example, nonlinear amplifying circuits generally have high power amplifier efficiency (PAE), while linear amplifying circuits generally have relatively low PAE.

Therefore, how to make a proper design to achieve a better balance between linearity and amplification efficiency of an amplifying circuit is a topic worthy of concern in the field of circuit design.

SUMMARY OF THE INVENTION

It is an objective of the invention to provide a design of an amplifying circuit with good linearity and power amplifier efficiency.

According to an embodiment of the invention, a power amplifying circuit comprises a first input terminal, a first amplifying circuit and a first matching circuit. The first input terminal is arranged to receive an input signal. The first amplifying circuit is coupled to the first input terminal and arranged to receive the input signal, generate a first output signal at a first terminal and generate a second output signal at a second terminal. The first matching circuit is coupled to the first amplifying circuit and arranged to combine the first output signal and the second output signal to generate an output signal. A first bias voltage is applied to the first input terminal and the first amplifying circuit is a push-pull amplifying circuit comprises a first transistor and a second transistor. The first transistor comprises a first electrode, a second electrode and a third electrode. The first electrode of the first transistor is coupled to the first input terminal, a second bias voltage is applied to the second electrode of the first transistor, the third electrode of the first transistor is coupled to the first terminal of the first amplifying circuit, and in response to the input signal, the first transistor generates the first output signal at the first terminal according the first bias voltage and the second bias voltage. The second transistor comprises a first electrode, a second electrode and a third electrode. The first electrode of the second transistor is coupled to the first input terminal, a third bias voltage is applied to the second electrode of the second transistor, the third electrode of the second transistor is coupled to the second terminal of the first amplifying circuit, and in response to the input signal, the second transistor generates the second output signal at the second terminal according the first bias voltage and the third bias voltage.

According to another embodiment of the invention, a power amplifying circuit comprises a first circuit sub-unit. The first circuit sub-unit comprises an input terminal, an amplifying circuit and a matching circuit. The input terminal is arranged to receive an input signal. The amplifying circuit is coupled to the input terminal and arranged to generate a first output signal at a first terminal and generate a second output signal at a second terminal. The matching circuit is coupled to the amplifying circuit and arranged to combine the first output signal and the second output signal to generate an output signal. A first bias voltage is applied to the input terminal and the amplifying circuit is a push-pull amplifying circuit comprises a NMOS transistor and a PMOS transistor. The NMOS transistor comprises a first electrode, a second electrode and a third electrode. The first electrode of the NMOS transistor is coupled to the input terminal, a second bias voltage is applied to the second electrode of the NMOS transistor, the third electrode of the NMOS transistor is coupled to the first terminal of the amplifying circuit, and in response to the input signal, the NMOS transistor generates the first output signal at the first terminal according the first bias voltage and the second bias voltage. The PMOS transistor comprises a first electrode, a second electrode and a third electrode. The first electrode of the PMOS transistor is coupled to the input terminal, a third bias voltage is applied to the second electrode of the PMOS transistor, the third electrode of the PMOS transistor is coupled to the second terminal of the amplifying circuit, and in response to the input signal, the PMOS transistor generates the second output signal at the second terminal according the first bias voltage and the third bias voltage.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
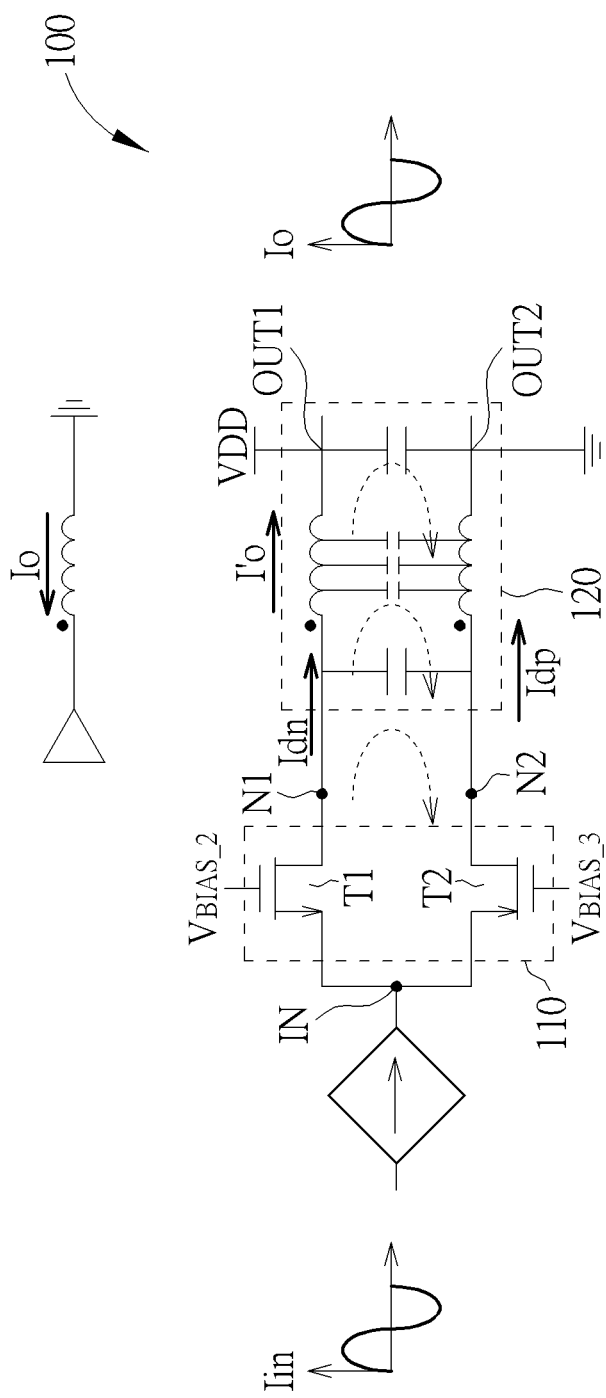
FIG. 1 shows an exemplary circuit diagram of a power amplifying circuit according to a first embodiment of the invention.

FIG. 1 shows an exemplary circuit diagram of a power amplifying circuit according to a first embodiment of the invention. The power amplifying circuit 100 may comprises an input terminal IN, an amplifying circuit 110 and a matching circuit 120. The input terminal IN is arranged to receive an input signal Iin, wherein the input signal Iin may be a current signal. The amplifying circuit 110 is coupled to the input terminal IN, and is arranged to receive the input signal Iin, generate a first output signal Idn at a first terminal N1 of the amplifying circuit 110 and generate a second output signal Idp at a second terminal N2 of the amplifying circuit 110 according to the input signal Iin. The matching circuit 120 is coupled to the amplifying circuit 110 for matching the output impedance of the power amplifying circuit 100 with the impedance of an antenna. According to an embodiment of the invention, the matching circuit 120 may be further arranged to combine the first output signal Idn and the second output signal Idp to generate an output signal Io'. The output signal Io' may be further coupled to the antenna through the coupling circuit of the antenna. The output signal Io that is finally provided to the antenna is generated through the aforementioned coupling effect.

According to an embodiment of the invention, besides receiving the input signal Iin, the input terminal IN may be further applied with a first bias voltage $V_{BIAS\_1}$ (not shown in FIG. 1), and the amplifying circuit 110 may be further applied with a second bias voltage $V_{BIAS\_2}$ and a third bias voltage $V_{BIAS\_3}$. By adjusting the level of the first bias voltage $V_{BIAS\_1}$, the level of the second bias voltage $V_{BIAS\_2}$ and the level of the third bias voltage $V_{BIAS\_3}$, the amplifying circuit 110 may be biased in class A, class B or class C amplifier operation. As an example, but not limited to, in a first embodiment of the invention, by setting the aforementioned bias voltage levels, the amplifying circuit 110 may operate as a class B amplifier.

According to an embodiment of the invention, the amplifying circuit 110 may be a push-pull power amplifying circuit, and may comprise transistors T1 and T2, such as the Metal Oxide Semiconductor Field Effect Transistors (MOSFETs). The transistors T1 and T2 may be different types of transistors. For example, in an embodiment of the invention, the transistor T1 may be an N-type MOS transistor (NMOS transistor for abbreviation) and the transistor T2 may be a P-type MOS transistor (PMOS transistor for abbreviation). The transistor T1 may comprise a first electrode, a second electrode and a third electrode. The first electrode of the transistor T1 is coupled to the input terminal IN, the second bias voltage $V_{BIAS\_2}$ is applied to the second electrode of the transistor T1, and the third electrode of the transistor T1 is coupled to the first terminal N1 of the amplifying circuit 110. The transistor T2 may comprise a first electrode, a second electrode and a third electrode. The first electrode of the transistor T2 is coupled to the input terminal IN, the third bias voltage $V_{BIAS\_3}$ is applied to the second electrode of the transistor T2 and the third electrode of the transistor T2 is coupled to the second terminal N2 of the amplifying circuit 110.

According to an embodiment of the invention, the first electrode, the second electrode and the third electrode of the transistors T1 and T2 may respectively be the source electrode, the gate electrode and the drain electrode. Since the source electrodes of the transistors T1 and T2 are coupled to the input terminal IN and the gate electrodes are respectively applied with a predetermined bias voltage, the amplifying circuit 110 may be a common gate amplifying circuit. In addition, since the first electrode and the second electrode of the transistor T1 are respectively applied with the first bias voltage $V_{BIAS\_1}$ and the second bias voltage $V_{BIAS\_2}$ and the first electrode and the second electrode of the transistor T2 are respectively applied with the first bias voltage $V_{BIAS\_1}$ and the third bias voltage $V_{BIAS\_3}$, and in an embodiment of the invention, an absolute value of the second bias voltage $V_{BIAS\_2}$ is higher than an absolute value of the first bias voltage $V_{BIAS\_1}$ and the absolute value of the first bias voltage $V_{BIAS\_1}$ is higher than an absolute value of the third bias voltage $V_{BIAS\_3}$, and in the operations of the power amplifying circuit 100, the transistors T1 and T2 may be operate in different signal periods. As an example, when the transistors are not native device, the second bias voltage $V_{BIAS\_2}$ is higher than the first bias voltage $V_{BIAS\_1}$ and the first bias voltage $V_{BIAS\_1}$ is higher than the third bias voltage $V_{BIAS\_3}$, and when transistors are native device, since the threshold voltage thereof may be a negative value, the second bias voltage $V_{BIAS\_2}$ may be smaller than the first bias voltage $V_{BIAS\_1}$ and the first bias voltage $V_{BIAS\_1}$ may be smaller than the third bias voltage $V_{BIAS\_3}$, and thus the absolute value of the second bias voltage $V_{BIAS\_2}$ may be higher than the absolute value of the first bias voltage $V_{BIAS\_1}$ and the absolute value of the first bias voltage $V_{BIAS\_1}$ may be higher than the absolute value of the third bias voltage $V_{BIAS\_3}$.

Referring to the exemplary waveforms shown in FIG. 1, the input signal Iin is a single tone signal with a predetermined frequency, as an example, the single tone signal A sin(ωt), where A represents the amplitude and ω represents the angular frequency of the aforementioned predetermined frequency. It is to be noted that the proposed power amplifying circuit is not limited to only receive the single tone signal as an input signal. As an example, the input signal of the circuit of a practical communication system may be a modulated signal.

According to an embodiment of the invention, in response to the input signal Iin, the transistor T2 may operate according to the first bias voltage $V_{BIAS\_1}$ and the third bias voltage $V_{BIAS\_3}$ in the former or the first half period of the input signal, to generate the second output signal Idp at the second terminal. Similarly, in response to the input signal Iin, the transistor T1 may operate according to the first bias voltage $V_{BIAS\_1}$ and the second bias voltage $V_{BIAS\_2}$ in the second half period of the input signal, to generate the first output signal Idn at the first terminal. The first output signal Idn and the second output signal Idp may respectively comprise the fundamental frequency component and even harmonic frequency components of the predetermined frequency, expressed as the following equations Eq. (1) and Eq. (2):

$$Idn = \frac{A}{\pi} + \frac{A}{2}\sin(\omega t) + \frac{2A}{3}\cos(2\omega t) + \frac{2A}{15}\cos(4\omega t) + \frac{2A}{35}\sin(6\omega t) + \ldots \qquad \text{Eq. (1)}$$

$$Idp = \frac{A}{\pi} + \frac{A}{2}\sin(\omega t) - \frac{2A}{3}\cos(2\omega t) - \frac{2A}{15}\cos(4\omega t) - \frac{2A}{35}\sin(6\omega t) + \ldots \qquad \text{Eq. (2)}$$

According to an embodiment of the invention, the matching circuit 120 may comprise a plurality of inductors. As an example, the matching circuit 120 may comprise two inductors coupled in parallel, wherein the first inductor is coupled between the first terminal N1 and the first output terminal OUT1 and the second inductor is coupled between the second terminal N2 and the second output terminal OUT2. In addition, according to an embodiment of the invention, one or more capacitors may be distributed on the two inductors, such as the one or more capacitors coupled between the first inductor and the second inductor as shown in FIG. 1. With this design, the first output signal Idn and the second output signal Idp may be combined into the output signal Io' through the matching circuit 120, and the alternating current (AC for abbreviation) component in the first output signal Idn and the second output signal Idp may be added together. Through the addition operations of the output signals, such as the dashed arrows shown in FIG. 1, the even harmonics frequency components in equations Eq. (1) and Eq. (2) may be weakened or even eliminated or cancelled. In this manner, as compared to the output signals Idn and Idp, the energy of even harmonic frequency components of the predetermined frequency in the output signal Io' may be weakened, or the output signal Io' does not include the even harmonic frequency components of the predetermined frequency as expressed in following equation Eq. (3).

$$Io'=Idp+Idn=A\sin(\omega t)=Iin \quad \text{Eq. (3)}$$

The output signal Io' may finally be further coupled to the antenna through the coupling circuit which is coupled to the antenna, such as an inductor. Suppose that Nnp represents the number of inductor coils coupled to the antenna, and No represents the number of inductor coils of the aforementioned first/second inductor, the output signal Io finally provided to the antenna may be expressed as the following equation Eq. (4):

$$Io = \frac{Nnp}{No}Io' = \frac{Nnp}{No}Iin \quad \text{Eq. (4)}$$

where the even harmonic frequency components of the predetermined frequency no longer exist in the output signal Io, and the output signal Io is a linear amplification of the input signal Iin.

According to an embodiment of the invention, the matching circuit 120 may receive power from a power supply VDD. As shown in FIG. 1, the first output terminal OUT1 may be coupled to the power supply VDD and the second output terminal OUT2 may be coupled to the ground. The level of the first bias voltage $V_{BIAS\_1}$ may be set to half the voltage of the power supply VDD or close to half the voltage of the power supply VDD. As an example, the first bias voltage $V_{BIAS\_1}$ may be set as $V_{BIAS\_1}$=VDD/2 or another value with slight increment or decrement based on this value. In addition, in the embodiment of the invention, a voltage difference between the second bias voltage $V_{BIAS\_2}$ and the first bias voltage $V_{BIAS\_1}$ may be substantially equal to (i.e., equal to or close to) a threshold voltage Vth1 of the transistor N1. As an example, the second bias voltage $V_{BIAS\_2}$ may be set as $V_{BIAS\_2}$=VDD/2+Vth1 or another value with slight increment or decrement based on this value. Similarly, a voltage difference between the third bias voltage $V_{BIAS\_3}$ and the first bias voltage $V_{BIAS\_1}$ may be substantially equal to (i.e., equal to or close to) a threshold voltage Vth2 of the transistor N2. As an example, the third bias voltage $V_{BIAS\_3}$ may be set as $V_{BIAS\_3}$=VDD/2+Vth2 another value with slight increment or decrement based on this value.

In the embodiments of the invention, by setting the level of the bias voltages, the common gate amplifying circuit may operate in a manner as a class B amplifier. Therefore, the power amplifying circuit 100 may have good linearity and perform amplification with high efficiency. It is to be noted that the proposed power amplifying circuit 100 is not limited to operate in a manner as a class B amplifier. As discussed above, the amplifying circuit 110 may also be biased in class A, class B or class C amplifier operation so as to operate as a class A, class B or class C amplifier. As an example, in another embodiment of the invention, an absolute value of the third bias voltage $V_{BIAS\_3}$ may be higher than the an absolute value of first bias voltage $V_{BIAS\_1}$ and the absolute value of the first bias voltage $V_{BIAS\_1}$ may be higher than an absolute value of the second bias voltage $V_{BIAS\_2}$, so that the amplifier circuit 110 is biased in class C amplifier operation. That is, by setting the level of the bias voltages, the amplifying circuit 110 may operate as a class C amplifier.

In addition, with the design of the matching circuit 120 as discussed above, the even harmonic frequency components of the predetermined frequency may be eliminated or cancelled, and will not be coupled to the antenna.

In addition, in the embodiment of the invention, by applying the aforementioned circuit design, the voltage across the terminals of the power amplifying circuit 100 will not exceed the rated voltage of power supply VDD during the overall operation. For example, as the amplitude of the input signal Iin increases, even if the transistor N1/N2 enters the triode region, since the third electrode (e.g. the drain electrode) and the first electrode (e.g. the source electrode) swing together with the input signal Iin, the maximum value of the voltage difference between the third electrode and the first electrode of the transistors N1 and N2 (e.g., the Vds of the transistors N1 and N2) will at most reach the voltage level of power supply VDD, and will not exceed the voltage VDD. That is, the maximum value of the voltage difference Vds will be limited not to exceed the voltage VDD. Therefore, the power amplifying circuit 100 has good reliability.

In addition, in the embodiments of the invention, the amplifying circuit 110 may have linear voltage swing Vswing. For example, the relationship between the input signal and the voltage swing may be Vswing=Iin*RL, where RL is the load impedance looking outward from the third electrode of the two transistors. Therefore, the magnitude of the voltage swing Vswing of the power amplifying circuit 100 at the third electrode of the transistors N1 and N2 may exceed half of the voltage of power supply VDD (e.g. VDD/2). That is, unlike conventional amplifier circuits in which the magnitude of the voltage swing Vswing is limited to be no more than half of the voltage of power supply VDD, the voltage swing Vswing of the power amplifying circuit 100 may exceed half of the voltage of power supply VDD. Thus, the power amplifying circuit 100 has good linearity. In addition, the power gain of the power amplifying circuit 100 is gm*RL, where gm is the transconductance of the transistor. Therefore, the power amplifying circuit 100 also has a high power amplification gain.

In addition, since the parasitic capacitances of transistors N1 and N2 have the characteristics of complementary, for example, when the parasitic capacitance Cgs between the second electrode (e.g., the gate electrode) and the first electrode (e.g., the source electrode) of transistor N2 is increased as the amplitude of the input signal increases, the parasitic capacitance Cgs of the transistor N1 is correspondingly decreased, so that the overall variation in parasitic capacitance is small. When the variation in capacitance is small, the variation in phase of the signal is correspondingly small, so that the power amplifying circuit 100 has good linearity in the amplitude modulation versus phase modulation (i.e., AM/PM). The parasitic capacitance Cgd between the second electrode (e.g. gate electrode) and the third electrode (e.g. drain electrode) of the transistors N1 and N2 also has the same characteristics.

In the first embodiment of the invention, the input signal Iin may be a single-ended signal. Therefore, FIG. 1 shows the structure of a one-stage single-ended power amplifying circuit. In other embodiments of the invention, the input signal Iin may also be a differential signal (or, a pair of differential signals, wherein the pair of differential signals may comprise inverted and non-inverted signals, each being a portion of the input signal and thus pair of differential signals may be collectively regarded as the input signal for case when the input signal Iin is a differential signal), and the proposed power amplifying circuit may also be modified into a differential power amplifying circuit based on the aforementioned single-ended circuit structure, or may be further modified into a circuit structure including a plurality of stages of differential amplifier. For example, the input terminal IN of the power amplifying circuit 100, the amplifying circuit 110 and the matching circuit 120 as a whole may be regarded as a circuit sub-unit, and the proposed power amplifying circuit may comprise more than one circuit sub-unit with the same, similar or a symmetrical circuit structure.

Figure 2:
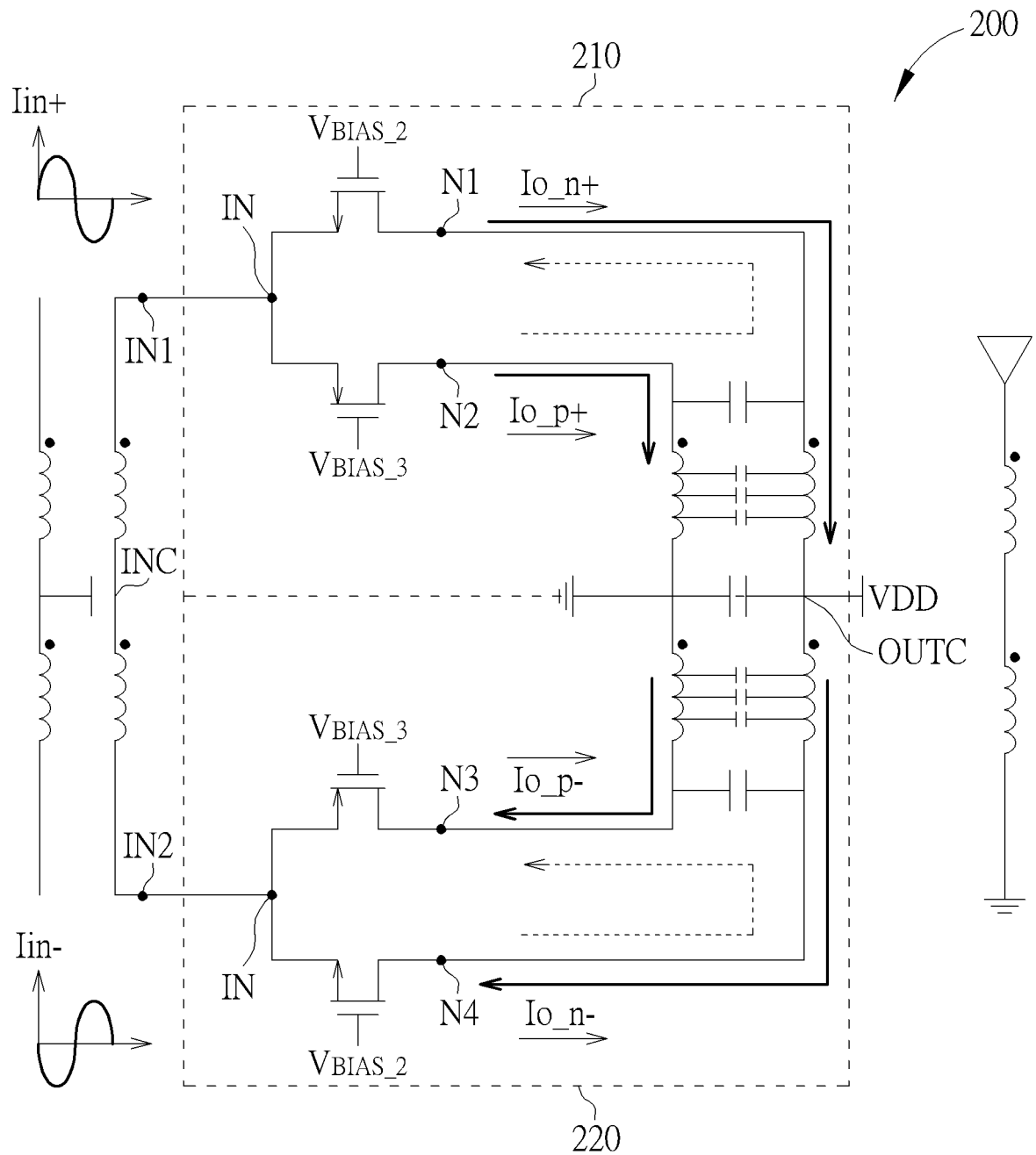
FIG. 2 shows an exemplary circuit diagram of a power amplifying circuit according to a second embodiment of the invention.

FIG. 2 shows an exemplary circuit diagram of a power amplifying circuit according to a second embodiment of the invention. The power amplifying circuit 200 may comprise the circuit sub-units 210 and 220, wherein the circuit sub-unit 210 has the same or similar circuit structure as the power amplifying circuit 100 shown in FIG. 1, thus introduction of the same portions will not be repeated here for brevity. The input terminal IN1 of the circuit sub-unit 210 may be arranged to receive the non-inverted portion of the input signal, such as the non-inverted input signal Iin+ shown in FIG. 2. The non-inverted output signals Io_n+ and Io_p+ are respectively generated at the first terminal N1 and second terminal N2 by the corresponding amplifying circuit according to the corresponding non-inverted input signal Iin+, and the non-inverted output signals Io_n+ and Io_p+ are combined by the corresponding matching circuit to generate the non-inverted portion of the output signal Io'. Similarly, the input terminal IN2 of the circuit sub-unit 220 may be arranged to receive the inverted portion of the input signal, such as the inverted input signal Iin− shown in FIG. 2, wherein there is a 180 degree phase difference between the non-inverted input signal Iin+ and the inverted input signal Iin−. The inverted output signals Io_n− and Io_p− are respectively generated at the third terminal N3 and fourth terminal N4 by the corresponding amplifying circuit according to the corresponding inverted input signal Iin−, and the inverted output signals Io_n− and Io_p− are combined by the corresponding matching circuit to generate the inverted portion of the output signal Io'.

The input terminals IN1 and IN2 may be commonly coupled to an input center point INC, the matching circuit of the circuit sub-unit 210 and the matching circuit of the circuit sub-unit 220 may be commonly coupled to an output center point OUTC, and the circuit sub-unit 210 (which comprises the corresponding amplifying circuit and matching circuit) and the circuit sub-unit 220 (which comprises the corresponding amplifying circuit and matching circuit) may be coupled in parallel between the input center point INC and the output center point OUTC.

In the embodiment of the invention, the circuit sub-unit 210 and the circuit sub-unit 220 may have symmetrical circuit structures, wherein the circuit sub-unit 210 and the circuit sub-unit 220 may comprise the same elements coupled in the same way, and the circuit sub-unit 210 and the circuit sub-unit 220 may be symmetrically coupled between the input center point INC and the output center point OUTC. Therefore, regarding the amplifier operation and circuit characteristics of the circuit sub-unit 210 and the circuit sub-unit 220, reference may be made to the descriptions of FIG. 1, and are not repeated here for brevity.

In this embodiment, the output center point OUTC may be coupled to the power supply VDD, the input terminals IN1 and IN2 may be respectively applied with the first bias voltage $V_{BIAS\_1}$ (not shown in FIG. 2). It should be noted that the first bias voltage $V_{BIAS\_1}$ may also be applied to the input center point INC, this change does not affect the operations of the power amplifying circuit 200. In addition, it should be understood that the capacitors coupled to the first output terminal OUT1 and the second output terminal OUT2 in FIG. 1 may be combined into a capacitor coupled between the output center point OUTC and the ground as shown in FIG. 2.

Figure 3:
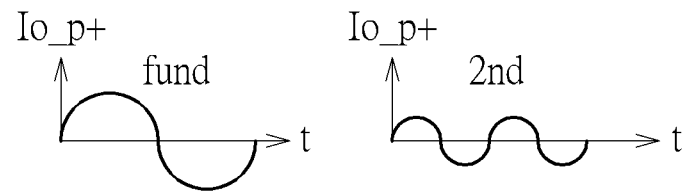
FIG. 3 is a schematic diagram showing the waveform of the non-inverted output signal according to the second embodiment of the invention.
Figure 3:
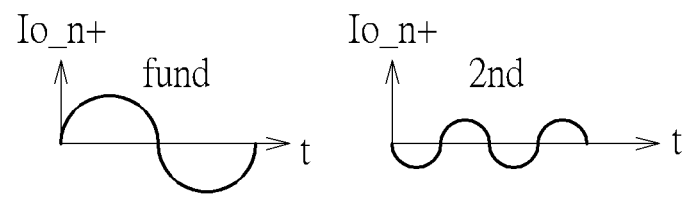
Figure 4:
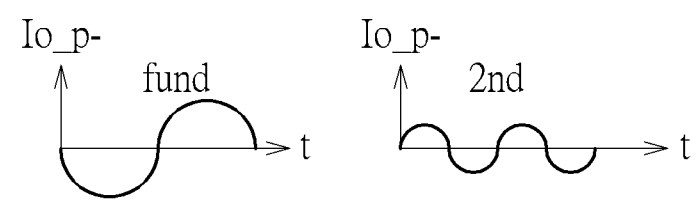
FIG. 4 is a schematic diagram showing the waveform of the inverted output signal according to the second embodiment of the invention.
Figure 4:
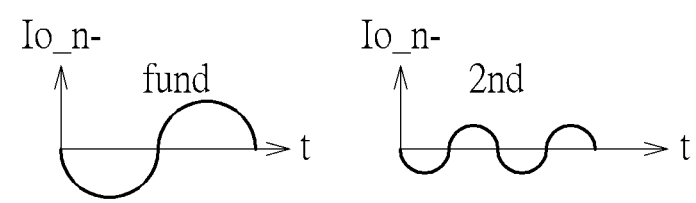

FIG. 3 is a schematic diagram showing the waveform of the non-inverted output signal according to the second embodiment of the invention. FIG. 4 is a schematic diagram showing the waveform of the inverted output signal according to the second embodiment of the invention. In the exemplary waveforms, the component with greater amplitude is the fundamental frequency component (labeled by fund) and the component with smaller amplitude is the even harmonic frequency component (labeled by 2nd), as an example, the second harmonic $$\frac{2A}{3}\cos(2\omega t)$$

in equations Eq. (1) and Eq. (2). FIG. 3 and FIG. 4 respectively shows the corresponding phase relationship of the fundamental frequency component (fund) and the even harmonic frequency component (2nd) at the same time point (starting from t=0).

As shown in FIG. 3, the fundamental frequency components of the non-inverted output signals Io_n+ and Io_p+ are in phase, and the second harmonic frequency components thereof are opposite in phase. Therefore, the non-inverted portion of the output signal Io' generated by combining the non-inverted output signals Io_n+ and Io_p+ may only have fundamental frequency components left. Similarly, the fundamental frequency components of the inverted output signals Io_n− and Io_p− are in phase, and the second harmonic frequency components thereof are opposite in phase. Therefore, the inverted portion of output signal Io' generated by combining the inverted output signals Io_n− and Io_p− may only have fundamental frequency components left.

In the first and second embodiments of the invention, the power amplifying circuit may comprise only one stage of amplifier. In other embodiments of the invention, the power amplifying circuit may comprise multiple stages of cascaded amplifiers.

Figure 5:
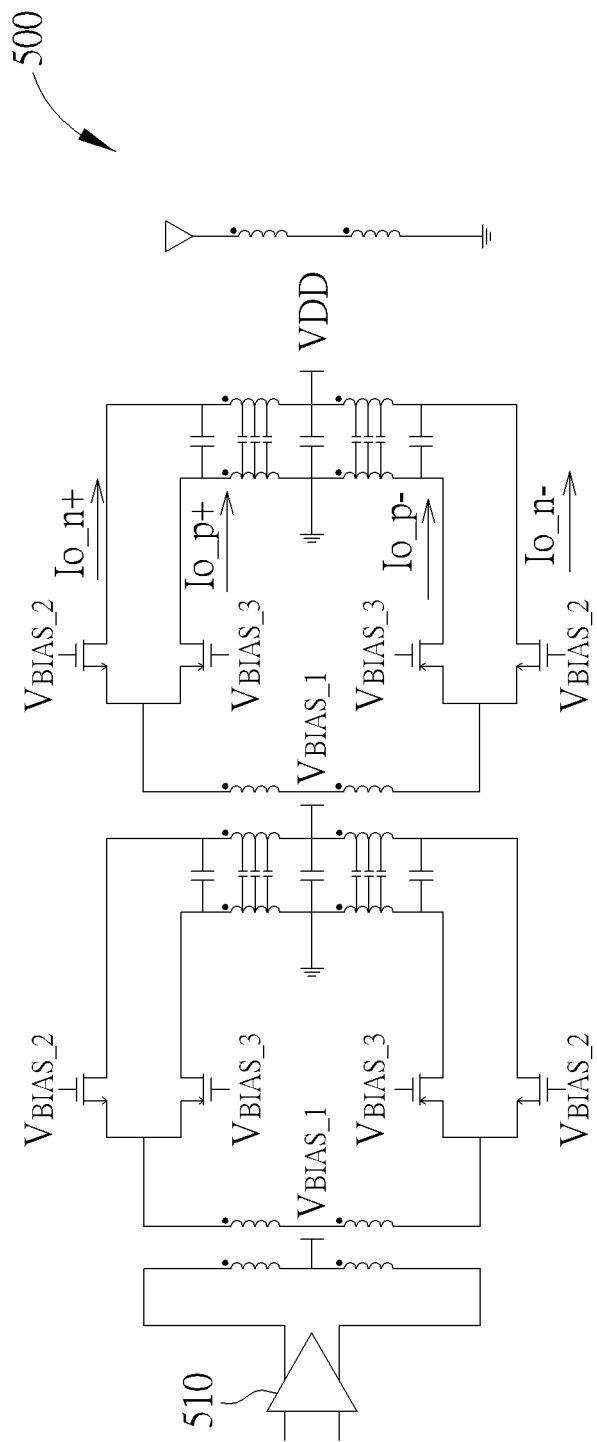
FIG. 5 shows an exemplary circuit diagram of a power amplifying circuit according to a third embodiment of the invention.

FIG. 5 shows an exemplary circuit diagram of a power amplifying circuit according to a third embodiment of the invention. The power amplifying circuit 500 may comprise pre-amplifier 510 and two stages of differential amplifiers. The two stages of differential amplifiers may comprise a first differential amplifier stage and a second differential amplifier arranged in a tandem structure. As an example, the first differential amplifier stage and the second differential amplifier may be coupled in serial between the pre-amplifier 510 and the antenna. The first differential amplifier stage and the second differential amplifier stage may have the same circuit structure, and such circuit structure may be the same as that of the power amplifying circuit 200 shown in FIG. 2. As an example, the circuit sub-units 210 and 220 may form any stage of differential amplifier. Therefore, regarding the amplifier operation and circuit characteristics of the power amplifying circuit 500, reference may be made to the descriptions of FIG. 1 and FIG. 2, and are not repeated here for brevity.

In the third embodiment of the invention, the power amplifying circuit comprises only one amplifying path. In other embodiments of the invention, the power amplifying circuit may comprise a plurality of amplifying paths arranged in parallel.

Figure 6:
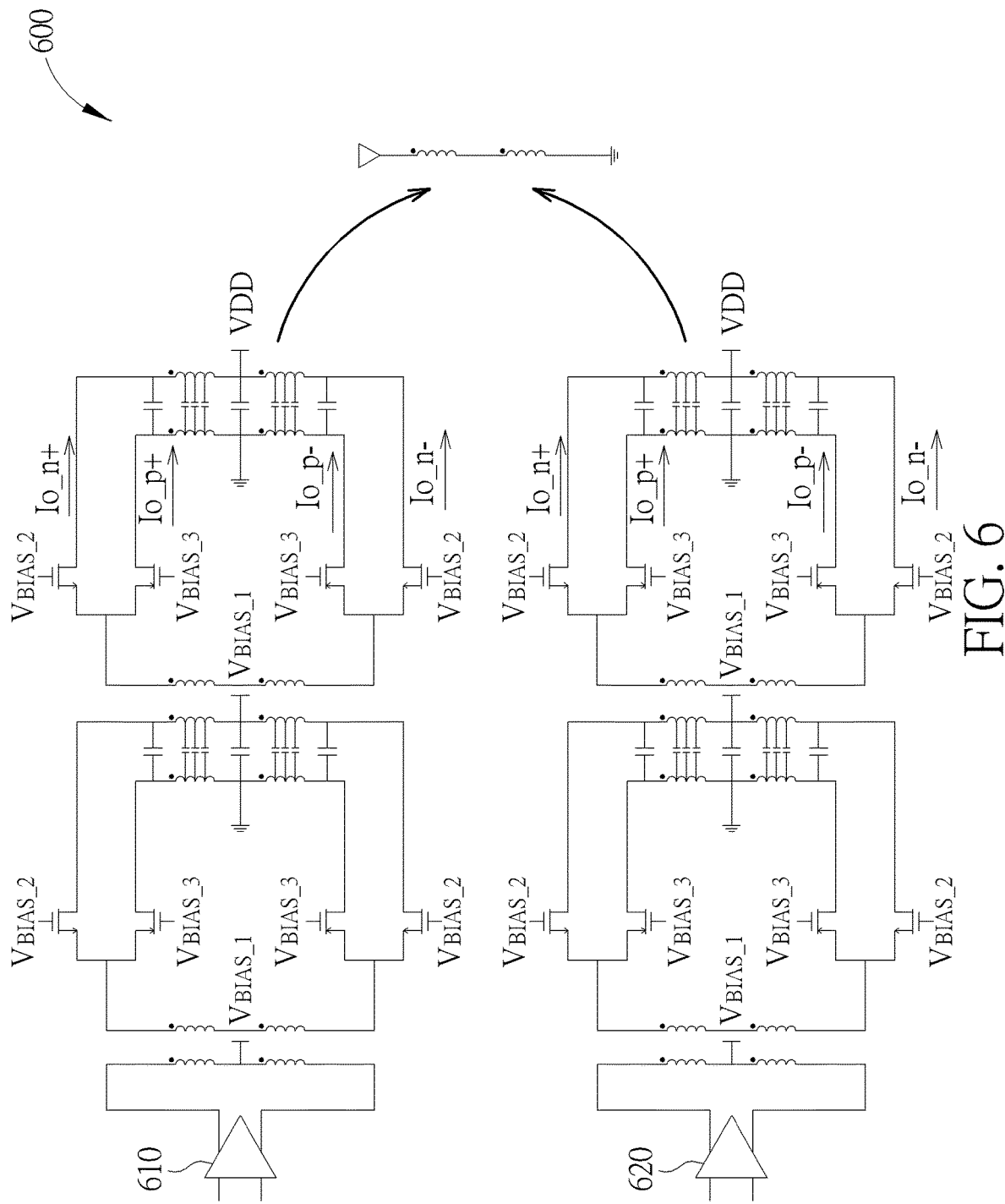
FIG. 6 shows an exemplary circuit diagram of a power amplifying circuit according to a fourth embodiment of the invention.

FIG. 6 shows an exemplary circuit diagram of a power amplifying circuit according to a fourth embodiment of the invention. In this embodiment, the power amplifying circuit 600 may comprise two amplifying paths arranged in parallel, wherein the pre-amplifier 610 and the two stages of differential amplifier may be disposed on a first amplifying path of the power amplifying circuit and the pre-amplifier 620 and the other two stages of differential amplifier may be disposed on a second amplifying path of the power amplifying circuit. That is, the circuit and/or circuit structure arranged on the second amplifying path of the power amplifying circuit 600 may be the same as the circuit and/or circuit structure arranged on the first amplifying path of the power amplifying circuit 600. In addition, the output signal generated on the first amplifying path and the output signal generated on the second amplifying path may be finally combined as a combined output signal, to further enhance the energy of the output signal. As an example, two output signals may be together coupled to the antenna to generate the output signal finally provided to the antenna.

In summary, in the embodiments of the invention, by virtue of the aforementioned circuit design and the setting of voltage levels of the bias voltages, the proposed power amplifying circuits have good linearity and perform amplification with high efficiency (PAE).

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A power amplifying circuit, comprising:
   a first input terminal, arranged to receive an input signal;
   a first amplifying circuit, having a first terminal and a second terminal, wherein the first amplifying circuit is coupled to the first input terminal, and is arranged to receive the input signal, generate a first output signal at the first terminal and generate a second output signal at the second terminal; and
   a first matching circuit, coupled to the first amplifying circuit and arranged to combine the first output signal and the second output signal to generate a combined output signal,
   wherein a first bias voltage is applied to the first input terminal and the first amplifying circuit is a push-pull amplifying circuit, comprising:
   a first transistor, comprising a first electrode, a second electrode and a third electrode, wherein the first electrode of the first transistor is coupled to the first input terminal, a second bias voltage is applied to the second electrode of the first transistor, the third electrode of the first transistor is coupled to the first terminal of the first amplifying circuit, and in response to the input signal, the first transistor generates the first output signal at the first terminal according the first bias voltage and the second bias voltage; and
   a second transistor, comprising a first electrode, a second electrode and a third electrode, wherein the first electrode of the second transistor is coupled to the first input terminal, a third bias voltage is applied to the second electrode of the second transistor, the third electrode of the second transistor is coupled to the second terminal of the first amplifying circuit, and in response to the input signal, the second transistor generates the second output signal at the second terminal according the first bias voltage and the third bias voltage;
   wherein in response to an absolute value of the second bias voltage being set to be higher than an absolute value of the first bias voltage, and the absolute value of the first bias voltage being set to be higher than an absolute value of the third bias voltage, the first amplifying circuit operates as a class B amplifier; or
   wherein in response to the absolute value of the third bias voltage being set to be higher than the absolute value of the first bias voltage, and the absolute value of the first bias voltage being set to be higher the absolute value of the second bias voltage, the first amplifying circuit operates as a class C amplifier.

2. The power amplifying circuit as claimed in claim 1, wherein the first transistor is an N-type transistor and the second transistor is a P-type transistor.

3. The power amplifying circuit as claimed in claim 1, wherein the input signal is a single-ended signal.

4. The power amplifying circuit as claimed in claim 1, wherein the input signal is a differential signal, the first input terminal is arranged to receive a first portion of the input signal, the first matching circuit is arranged to combine the first output signal and the second output signal to generate a first portion of the combined output signal, and the power amplifying circuit further comprises:
   a second input terminal, arranged to receive a second portion of the input signal;
   a second amplifying circuit, coupled to the second input terminal and arranged to receive the second portion of the input signal, and generate a third output signal at a third terminal and a fourth output signal at a fourth terminal according to the second portion of the input signal; and
   a second matching circuit, coupled to the second amplifying circuit and arranged to combine the third output signal and the fourth output signal to generate a second portion of the combined output signal.

5. The power amplifying circuit as claimed in claim 4, wherein the first input terminal and the second input terminal are commonly coupled to an input center point, the first matching circuit and the second matching circuit are commonly coupled to an output center point, and the first amplifying circuit and the first matching circuit and the second amplifying circuit and the second matching circuit are coupled in parallel between the input center point and the output center point.

6. The power amplifying circuit as claimed in claim 5, wherein the first input terminal and the second input terminal, the first amplifying circuit, the second amplifying circuit, the first matching circuit and the second matching circuit form a first differential amplifier stage, and the power amplifying circuit further comprises a second differential amplifier stage having the same circuit structure as the first differential amplifier stage, and the first differential amplifier stage and the second differential amplifier stage are arranged in a tandem structure.

7. The power amplifying circuit as claimed in claim 1, wherein the input signal is a single tone signal with a predetermined frequency, the first output signal and the second output signal respectively includes a fundamental frequency component and even harmonic frequency components of the predetermined frequency, and the combined output signal does not include the even harmonic frequency components of the predetermined frequency.

8. A power amplifying circuit, comprising:
a first circuit sub-unit, comprising:
an input terminal, arranged to receive an input signal;
an amplifying circuit, coupled to the input terminal and arranged to generate a first output signal at a first terminal and generate a second output signal at a second terminal; and
a matching circuit, coupled to the amplifying circuit and arranged to combine the first output signal and the second output signal to generate a combined output signal,
wherein a first bias voltage is applied to the input terminal and the amplifying circuit is a push-pull amplifying circuit, comprising:
a NMOS transistor, comprising a first electrode, a second electrode and a third electrode, wherein the first electrode of the NMOS transistor is coupled to the input terminal, a second bias voltage is applied to the second electrode of the NMOS transistor, the third electrode of the NMOS transistor is coupled to the first terminal of the amplifying circuit, and in response to the input signal, the NMOS transistor generates the first output signal at the first terminal according the first bias voltage and the second bias voltage; and
a PMOS transistor, comprising a first electrode, a second electrode and a third electrode, wherein the first electrode of the PMOS transistor is coupled to the input terminal, a third bias voltage is applied to the second electrode of the PMOS transistor, the third electrode of the PMOS transistor is coupled to the second terminal of the amplifying circuit, and in response to the input signal, the PMOS transistor generates the second output signal at the second terminal according the first bias voltage and the third bias voltage;
wherein in response to an absolute value of the second bias voltage being set to be higher than an absolute value of the first bias voltage, and the absolute value of the first bias voltage being set to be higher than an absolute value of the third bias voltage, the amplifying circuit operates as a class B amplifier; or
wherein in response to the absolute value of the third bias voltage being set to be higher than the absolute value of the first bias voltage, and the absolute value of the first bias voltage being set to be higher the absolute value of the second bias voltage, the amplifying circuit operates as a class C amplifier.

9. The power amplifying circuit as claimed in claim 8, wherein the input signal is a single-ended signal.

10. The power amplifying circuit as claimed in claim 8, wherein the input signal is a differential signal.

11. The power amplifying circuit as claimed in claim 10, further comprising:
a second circuit sub-unit, wherein the first circuit sub-unit is arranged to receive a first portion of the input signal, the second circuit sub-unit is arranged to receive a second portion of the input signal, the second circuit sub-unit and the first circuit sub-unit have symmetric circuit structure, and the first circuit sub-unit and the second circuit sub-unit are coupled in parallel between an input center point and an output center point.

12. The power amplifying circuit as claimed in claim 11, wherein the first circuit sub-unit and the second circuit sub-unit form a first differential amplifier stage, and the power amplifying circuit further comprises a second differential amplifier stage having the same circuit structure as the first differential amplifier stage, and the first differential amplifier stage and the second differential amplifier stage are arranged in a tandem structure.

13. The power amplifying circuit as claimed in claim 12, wherein the first differential amplifier stage and the second differential amplifier stage are disposed on a first amplifying path of the power amplifying circuit, and the power amplifying circuit further comprises a second amplifying path, a circuit structure on the second amplifying path is the same as that on the first amplifying path, and the output signal generated on the first amplifying path and a second output signal generated on the second amplifying path are finally combined as a final combined output signal.

14. The power amplifying circuit as claimed in claim 8, wherein the input signal is a single tone signal with a predetermined frequency, the first output signal and the second output signal respectively includes a fundamental frequency component and even harmonic frequency components of the predetermined frequency, and the combined output signal does not include the even harmonic frequency components of the predetermined frequency.

* * * * *